United States Patent [19]
Bartels et al.

[11] Patent Number: 5,953,480
[45] Date of Patent: *Sep. 14, 1999

[54] COMB FILTER ARRANGEMENT

[75] Inventors: Cord-Heinrich Bartels; Thomas Suwald, both of Hamburg; Sönke Struck, Neu-Wulmstorf; Jörg Wölber, Pinneberg-Thesdorf, all of Germany

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/678,216

[22] Filed: Jul. 11, 1996

[30] Foreign Application Priority Data

Jul. 15, 1995 [DE] Germany .............................. 195 25 804

[51] Int. Cl.$^6$ ................................ H04N 9/79; H04N 9/78
[52] U.S. Cl. .............................. 386/25; 348/665; 348/667
[58] Field of Search ...................... 386/1, 2, 3, 21, 386/22, 25, 46, 47; 348/606, 607, 609, 618, 663, 665, 667; H04N 5/91, 5/911, 9/78, 9/79

[56] References Cited

U.S. PATENT DOCUMENTS

| | | | |
|---|---|---|---|
| 3,996,606 | 12/1976 | Pritchard | 386/25 |
| 4,001,826 | 1/1977 | Moulton | 342/110 |
| 4,007,482 | 2/1977 | Amari | 386/23 |
| 4,184,174 | 1/1980 | Aschwanden | 348/665 |
| 4,456,921 | 6/1984 | Hess | 348/665 |
| 4,714,958 | 12/1987 | Holz et al. | 348/625 |
| 4,868,650 | 9/1989 | Weckenbrock | 348/701 |
| 4,992,852 | 2/1991 | Sekizawa et al. | 348/455 |
| 5,041,904 | 8/1991 | Higuchi et al. | 386/44 |
| 5,097,321 | 3/1992 | Stern et al. | 348/450 |
| 5,124,784 | 6/1992 | Takahashi et al. | 348/572 |
| 5,453,710 | 9/1995 | Gilbert et al. | 327/277 |
| 5,469,218 | 11/1995 | Sakaegi et al. | 348/455 |
| 5,514,997 | 5/1996 | Quinn | 327/554 |

OTHER PUBLICATIONS

Grindig Technische Information 3–84, "Der Chromabaustein der neuen VHS–Recorder", pp. 144–150.

*Primary Examiner*—Thai Than
*Attorney, Agent, or Firm*—Michael E. Belk

[57] ABSTRACT

A comb filter arrangement comprising at least one delay circuit and an adder, this adder being twice supplied with a video signal modulated on a carrier, which video signals are applied mutually shifted with time. The signals are delayed by the delay circuits, so that either video signal applied to the adder is delayed relative to the other video signal by a given period of time. Furthermore, the delay circuits are arranged in switched capacitor technique.

20 Claims, 2 Drawing Sheets

COMB FILTER ARRANGEMENT

BACKGROUND OF THE INVENTION

The invention relates to a comb filter arrangement including at least one delay circuit and an adder, this adder being twice supplied with a video signal modulated on a carrier, which video signals are applied mutually shifted with time.

For PAL signals such state of the art comb filter arrangements are usually structured such that the input signal of the comb filter arrangement reaches an input of the adder undelayed and reaches a second input delayed for the duration of two picture lines. It is then necessary for the delay period of this second signal to have the given value. However, for manufacturing reasons of the delay circuit this delay circuit often does not have the desired value, that is to say, the duration of two picture lines. For video signals according to the NTSC standard the signals applied to the adder have a mutual delay of the duration of one picture line of the video signal. Here too the drawback appears that this value cannot always be exactly adhered to.

Examples for such a comb filter arrangement are the comb filter arrangements for video recorders for filtering out the color under signal. Such an arrangement is known, for example, from Grundig Technische Informationen 3-84, pages 144–150. The arrangement is used for suppressing adjacent track originating crosstalk color under signals in a PAL color signal read from a video tape. Also the comb filter arrangement known from this publication is designed so that the input signal reaches an input of an adder undelayed and a second input delayed for the duration of two picture lines.

This arrangement too has the drawback mentioned above that the sole delay circuit is to have a given delay value.

In such known comb filter arrangements the delay circuit used has the structure of a glass delay line, a CCD (Charge-Coupled Device) delay line, or a digital delay line.

SUMMARY OF THE INVENTION

It is an object of the invention to further develop a comb filter arrangement of the type defined in the opening paragraph to the effect that it is easily integrable, provides greater latitude for the delay period of the delay circuit and minimizes the signal delay for the signal to be processed.

According to the invention, this object is achieved in that at least one of the video signals applied to the adder is delayed by the delay circuit(s) so that the relative delay of the two video signals applied to the adder is an integral-numbered multiple of the duration of one picture line of the video signal plus/minus the duration of an integral-numbered multiple of the duration of one period of the carrier frequency and in that the delay circuit(s) is (are) arranged in switched capacitor technique.

In the known comb filter arrangements there is always assumed that an orthogonal comb filtering is to be effected. For PAL signals this means that the two signals applied to the adder are to be delayed relative to each other for the duration of two picture lines. For NTSC signals this value is the duration of one picture line. The invention is based on the recognition that such an orthogonal filtering is not actually necessary. Substantially identical filter results are obtained if so-called non-orthogonal comb filtering is used. The delay value may then exceed or fall short of the integral-numbered multiple of the picture lines (depends on the transmission standard) for an integral-numbered multiple of the duration of one period of the chrominance carrier frequency. This means that the delay circuit included in the comb filter arrangement needs not effect a delay of exactly an integral-numbered multiple of the duration of one picture line of the video signal. A deviation from this value may be permitted, but this deviation should be selected such that the above-mentioned requirement of the relative delay of the two video signals applied to the adder is satisfied. The advantage especially resides in the fact that the manufacture of such comb filter arrangements which include delay circuits that have a shorter delay than the duration of the integral-numbered multiple of one picture line is considerably simpler.

Furthermore, there is provided that delay circuit(s) in the comb filter arrangement is (are) structured in switched capacitor technique. The switched capacitor technique has the benefit of being easy to manufacture in the form of an integrated circuit.

According to an embodiment of the invention there is provided that the two video signals applied to the adder are delayed by a delay circuit each and that the relative delay of the two signals applied to the adder is selected such that the output signals of the delay circuit are delayed relative to each other for an integral-numbered multiple of the duration of one picture line of the video signal plus/minus the duration of an integral-numbered multiple of the duration of one period of the carrier frequency.

Two delay circuits are provided whose delay periods are such that the difference of time shows the desired mutual relative delay by an integral-numbered multiple of the duration of a picture line of the video signal plus/minus the duration of an integral-numbered multiple of a period of the carrier wave. The delay periods of the two delay circuits are then to be selected such that the signals having the desired phase position are superimposed in the adder.

For example, for a television signal which is to be superimposed in the adder once as an undelayed version and once delayed for the duration of two picture lines, there is no requirement for either delay circuit to produce a delay of two picture lines. Either delay circuit had rather produce a different delay, but then the other delay circuit can, with respect to its delay time, be arranged so that the two output signals are again superimposed for the desired delay period.

According to a further embodiment of the invention there is provided that the video signal is in accordance with the PAL transmission standard and that the two video signals applied to the adder are delayed relative to each other for the duration of two picture lines of the video signal plus/minus the duration of an integral-numbered multiple of the duration of one period of the carrier frequency.

For video signals according to the PAL transmission standard the non-orthogonal comb filtering mentioned above is achieved when this requirement of the relative delay of the two signals applied to the adder is satisfied.

For video signals according to the NTSC transmission standard, however, another requirement is to be satisfied. Therefore, according to a further embodiment of the invention there is provided that such signals are shifted with time relative to each other for the duration of one picture line of the video signal plus/minus the duration of an integral-numbered multiple of the duration of one period of the chrominance carrier frequency.

According to a further embodiment of the invention there is provided that the two delay circuits have memory capacitors whose stored values can be read from a readout line shared by the two delay circuits on which readout line the stored values are additively superimposed when read out, so that the readout line represents the adder.

The structure of the switched capacitor technique delay circuits means to imply that memory capacitors are provided in which the sample values of the signals to be delayed are written. After the desired delay period, the sample values are again read from the memory cells. For the comb filter arrangement according to the invention the use of the switched capacitor technique according to the invention additionally creates the possibility of providing a common readout line for the memory capacitors of the two delay circuits. This saves circuitry. During the reading process the values of the two delay circuits read from the memory capacitors are superimposed on the common readout line. The readout line thus takes over the function of the adder. A separate adder is therefore no longer necessary.

According to a further embodiment of the invention there is provided that each memory capacitor is assigned a read transistor by which a charge stored in the memory capacitor can be read out on the readout line, that compensating transistors of like number, line connection and structure to the read transistors connected to the readout line are connected to the compensation line, and that an amplifier is included to whose non-inverting input is coupled the readout line and to whose inverting input is coupled the compensation line and which produces the comb-filtered signal on its output.

This arrangement is particularly capable of compensating for capacitive effects of the read transistors which are assigned to the memory capacitors. This compensates for the influencing of the signals which is effected by the capacitances of the read transistors.

According to a further embodiment of the invention there is provided that the video signal applied to the comb filter arrangement is a color under signal modulated on a chrominance carrier, which color under signal is filtered from a reading signal of a video recorder, and that the relative time shift of the two signals applied to the adder is an integral-numbered multiple of the duration of one picture line of the video signal plus/minus the duration of an integral-numbered multiple of the duration of one period of the chrominance carrier frequency.

For the recording on video tapes, video signals are modulated on various carriers. In the so-called color-under-method, the color under signals are modulated on relatively low-frequency carriers. When a track is read out, not only the color signals of this track, but also crosstalk color signals from neighboring tracks are read out. Comb filter arrangements are known to suppress these crosstalk color signals. However, they do have the above-described drawbacks. Therefore, the comb filter arrangement according to the invention may be inserted instead, in which for such color signals the relative shift of the two signals applied to the adder is to be an integral-numbered multiple of the duration of one picture line of the video signal plus/minus the duration of an integral-numbered multiple of the duration of one period of the chrominance carrier frequency, as a result of which the color under signals are superimposed so that the crosstalk color signals are suppressed and the useful color signals are superimposed in phase. This condition may particularly be satisfied in that two delay circuits are used and in that the relative time shift of the output signals of the two delay circuits satisfies this condition. It is not absolutely necessary then for the time shift of the two signals to correspond exactly to an integral-numbered multiple of the duration of one picture line. Due to the relatively small resolution of the color signal, also a shift lasting an integral-numbered multiple of the duration of one period of the chrominance carrier frequency may be permitted, without this shift becoming visible in the picture.

In further embodiments for such a comb filter arrangement according to the invention the color signal is sampled with a sampling clock before it is processed in the delay element(s), which clock is an integral-numbered multiple of, but at least twice the double chrominance carrier frequency, that is to say, four times the chrominance carrier frequency.

For maintaining the phase relationship, it is advantageous for the sampling clock of the color signal to be an integral-numbered multiple of the chrominance carrier frequency. It is then rather simply possible to adhere to the mutual relative time relationship of the two signals, because the delay periods are four times this sampling clock.

For example, a video signal of the PAL standard, recorded on the video tape, is preprocessed in the manner described above to be recorded so that the luminance signal and the color signal respectively, are modulated on various carriers having different frequencies. A signal preprocessed in this manner is divided into the luminance signal and the color signal after this preprocessed signal has been read. After this filtering, the color signal may advantageously be freed in the comb filter arrangement according to the invention from adjacent track originating crosstalk color signals. The time shift of the two signals applied to the adder is then twice the duration of a picture line of the video signal plus/minus an integral-numbered multiple of the duration of one period of the chrominance carrier frequency.

Accordingly, for NTSC signals there is provided that the relative time shift of the two signals applied to the adder is one time the duration of one picture line of the video signal plus/minus the duration of an integral-numbered multiple of the duration of one period of the chrominance carrier frequency.

A further embodiment of the invention provides that a first delay circuit delays the color signal for the duration of two picture lines minus the duration of half a period of the chrominance carrier and a second delay circuit delays the color signal for the duration of half a period of the chrominance carrier and that the output signals of the two delay circuits are applied to the adder.

For example, for manufacturing reasons there are delay circuits which are incapable of effecting a delay of signals applied thereto by exactly the duration of two picture lines of the video signal. In that case a known delay circuit which delays the color signal for the duration of two picture lines minus the duration of half a period of the chrominance carrier can be used. If, however, the output signal of this delay circuit were added to the undelayed input signal of the comb filter arrangement (as in the state of the art), the signals would not be superimposed in the desired phase position. Therefore, according to the invention, a second delay circuit is provided which delays the color signal for the duration of half a period of the chrominance carrier. This in turn guarantees that the signals are superimposed with the required phase position in the adder.

A comb filter arrangement according to the invention may advantageously be incorporated in a video recorder, especially for filtering out on the reproduction side color under signals caused by crosstalk from adjacent tracks.

These and other aspects of the invention will be apparent from and elucidated with reference to the embodiments described hereinafter.

DESCRIPTION OF THE PREFERRED EMBODIMENTS

In the following will be explained with reference to FIG. 1 the problem which occurs in video recorders when color signals from neighboring tracks cause crosstalk to occur when a video signal or color under signal is read from a specific track of a tape. The arrangement shown in FIG. 2 is used for suppressing these crosstalk color signals.

Figure 1:
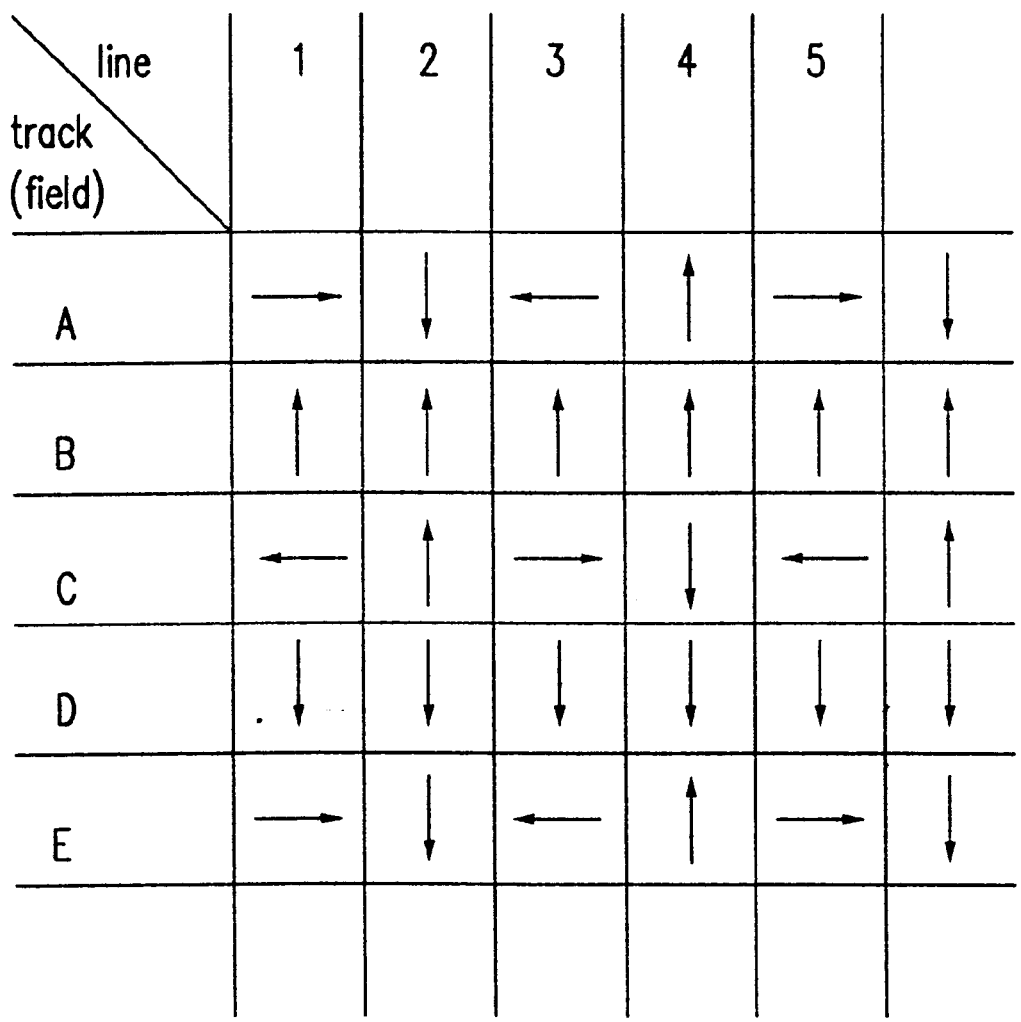
FIG. 1 gives a diagrammatic representation of a video signal recorded on a tape with phase positions of the recorded video signal which alternate from one picture line to the next and from one track of the tape to the next.
Figure 2:
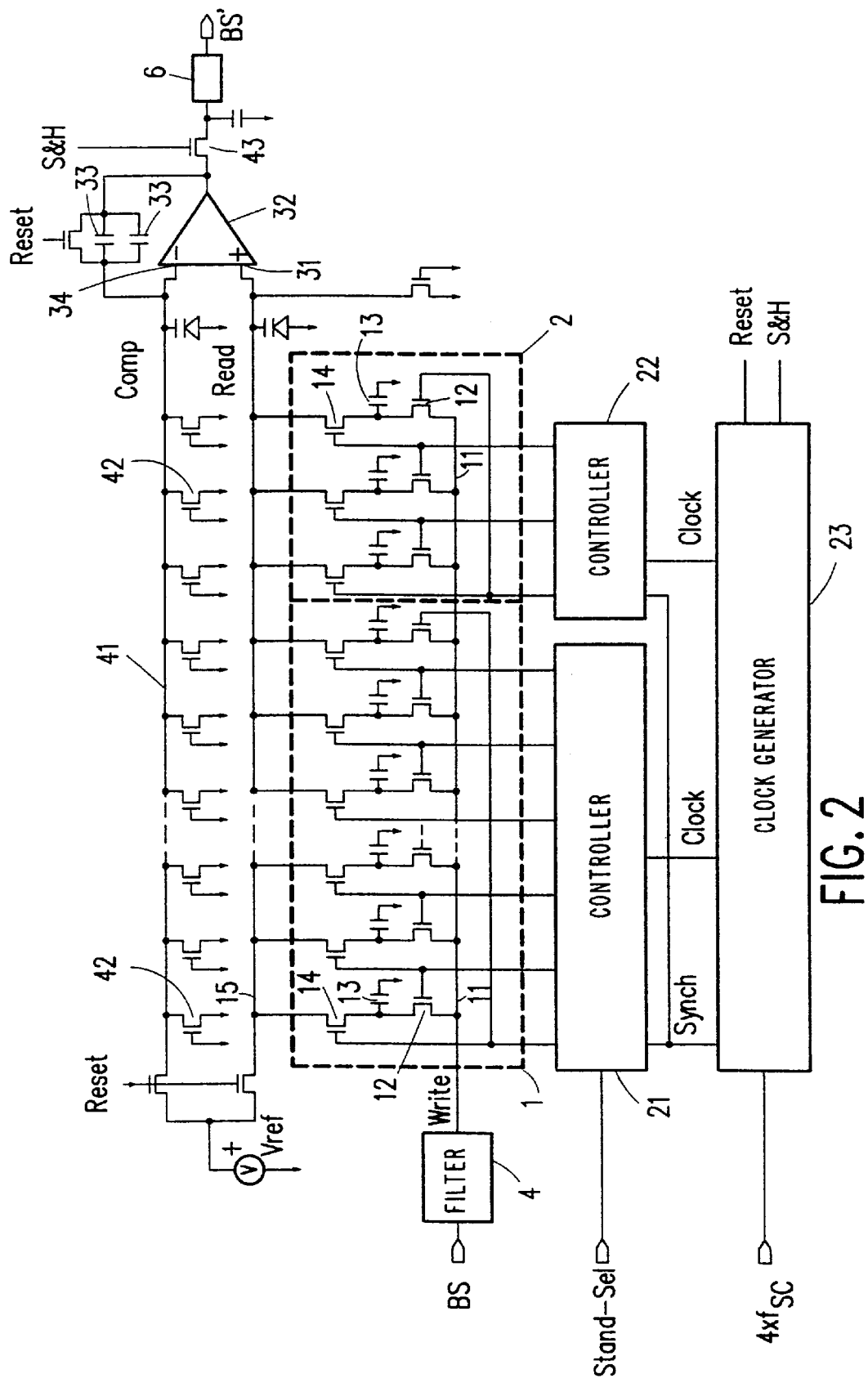
FIG. 2 shows a comb filter arrangement for suppressing color signals that cause crosstalk in a color under signal which is read from a tape of a video recorder.

FIG. 1 gives a diagrammatic representation showing on the rows five fields A, B, C, D and E as they may be recorded, for example, on a video tape. Furthermore, five columns are shown in which the phase position of the recorded signal is symbolized by an arrow.

The signal phase positions to be discussed below relate to the phase position of the color under signal relative to the phase position of the chrominance carrier. Additional shift keying of the phase length of the chrominance carrier as they occur in several color transmission systems are not taken into account in this approach.

For example, for the recording of a PAL signal on apparatus of the VHS standard, the phase position of the color under signal in every next field is changed by 90° from one line to the next. This results in successive phase positions of 0°, 90°, 180°, 270°, 0°, 90° and so on and so forth. This is the case, for example, in the rows A, C and E of the representation of FIG. 1. In the further tracks the phase position is retained for all the lines, but in these remaining tracks the phase position is changed between 0 and 180° from one track to the next. This is shown by the tracks B and D of the representation of FIG. 1.

If, for example, line 3 of field B is read out, the comb filter is conventionally arranged in such a way that the signal B3 and the signal B1 i.e. a signal delayed for the duration of two picture lines, are additively superimposed. The representation of FIG. 1 shows that the useful signals B3 and B1 are actually mutually superimposed in-phase.

Simultaneously, however, when the signal B3 is read out, there is crosstalk from the adjacent signals A3 and C3. Because of the superpositioning by the previously read signal B1, which is affected by crosstalk from the signals A1 and C1, these signals causing crosstalk are canceled as a result of their phase position. The crosstalk signal A3 is in quadrature phase to the crosstalk signal A1, so that these two signals cancel each other. The same holds for the signals C3 and C1.

Accordingly holds, for example, if a signal of the picture line C is read out. It is then to be considered that the originally effected change of the phase position by 90° from one line to the next is to be canceled in the reading signal. This causes the reading signals of, for example, C3 and C1 to be superimposed again in-phase. Since this phase inversion is canceled, the crosstalk signals B1 and B3 are in quadrature phase. The same holds for the crosstalk signals D3 and D1.

In this explanation of the representation of FIG. 1 there was assumed that the two signals to be superimposed are delayed relative to each other for the duration of two lines. But this is actually not necessary, because the color signal has a relatively lower resolution or transmission bandwidth. Therefore, it is sufficient for the two superimposed color under signals in the case of the PAL signal to be shifted with time relative to each other for the duration of two picture lines plus/minus an integral-numbered multiple of the duration of one period of the chrominance carrier signal. In fact, the color information signals of the same picture dots of two picture lines are not superimposed, but on account of the bandwidth requirement this is of no consequence. The overriding matter is, however, that the color under signals modulated on the chrominance carrier are superimposed in-phase. This safeguards that the crosstalk color signals are superimposed in quadrature phase and are thus canceled.

FIG. 2 shows an illustrative embodiment for a comb filter arrangement in which these facts are utilized. Two delay circuits 1 and 2 are included in the comb filter arrangement, first delay circuit 1 having a delay of the duration of two picture lines minus the duration of half a period of the frequency of the chrominance carrier signal, and the second delay circuit 2 delaying the signal applied thereto for the duration of half a period of the frequency of the chrominance carrier. Contrary to the state-of-the-art arrangements, no delay circuit which exactly delays for the duration of two picture lines is needed here. What is more, for technological reasons are available delay elements which have a delay in accordance with the first delay circuit. Therefore, according to the invention, the second delay circuit is used by which the additively superimposed signals with respect to their phase position are again set to one another, so that the superpositioning effects of the crosstalk color signals mentioned above are obtained.

The two delay circuits 1 and 2 are arranged in a so-called switched capacitor technique, i.e. sample values are taken from the picture signals, which sample values are input in memory capacitors. After a given delay period, these charges stored in the memory capacitors are again read out on a readout line. In the illustrative embodiment shown in FIG. 2, as will be explained below, a common readout line shared by the two delay circuits 1 and 2 is provided which takes over the function of the adder.

The representation of FIG. 2 shows that the picture signal applied to the input of the comb filter arrangement is first applied to the filter 4 whose output signal reaches the first delay circuit 1 and the second delay circuit 2.

For these two delay circuits there is a common readin line 11. Each of the delay circuits includes a certain number of delay elements which number depends on the selected sampling clock and also on the delay time desired for the respective delay circuit 1 or 2.

Each delay element includes a write transistor 12 whose input is connected to the readin line 11. Each delay element further includes a memory capacitor 13 which is connected, on the one hand, to the write transistor 12 and, on the other hand, to a read transistor 14. The read transistors 14 of all the delay elements of the two delay circuits 1 and 2 operate on the output side on a common readout line 15.

The write transistors 12 as well as the read transistors 14 are triggered by controllers 21 and 22, respectively.

A controller 21 controls the delay circuit 1. An write transistor of a memory cell n and also the read transistor of the next memory cell n+1 are then always operated collectively.

For the duration of the delay period by which the picture signal is delayed in the delay circuit 1, the transmission standard of the picture signal BS is to be taken into account. For this purpose, the controller 21 is supplied with a signal STAND-SEL which denotes the transmission standard of the picture signal. For example, in accordance with the above observations, for a PAL picture signal and for the desired phase relationship of the two superimposed signals, there is a delay of two picture lines of the picture signal minus the duration of half a period of the chrominance carrier wave. The controller 21 then accordingly controls the write or read transistors 12 or 14 respectively, or takes into account the necessary number of memory elements.

The controllers 21 and 22 are supplied with a clock signal referenced Clock in FIG. 2 and a synchronization signal referenced Sync. This clock signal is produced by a clock generator 23. The clock signal Clock is especially intended for indicating to the controllers 21 and 22 respectively, the instants at which a value is loaded from a memory cell n into the memory capacitor 13 of this cell and, simultaneously, from the memory capacitor 13 of the memory cell n+1 the charge value stored in the memory capacitor 13 is read out on the readout line 15. This clocked charging of the memory capacitors 13 provides a quasi-scanning of the picture signal BS. In the illustrative embodiment shown in FIG. 2, this sampling clock and thus the frequency of the signal Clock is four times the frequency of the chrominance carrier wave. The selection of this frequency is therefore advantageous because the setting of the necessary phase relationships of the output signals of the two delay circuits 1 and 2 can be effected relatively easily, as will be explained below.

The controller 21 controls its assigned memory elements of the delay circuit so that samples of the picture signal BS can be taken with this sampling clock and successively be entered in the memory capacitor 13 of various memory elements of the memory circuit 1. Due to the coupling of the control lines of the write transistors 12 with the read transistors 14 including respective successive memory cells, the data stored in the memory capacitors 13 are simultaneously read out on the readout line 15. The number of memory elements or the number of memory elements that can be activated by the controller 21 respectively, then determine the delay time of the picture signal which reaches the readout line 15 in the form of sample values. The delay of these sample values of the picture signal which are produced on the readout line 15 relative to the input signal on the readin line 11 amounts to the duration of two picture lines of the picture signal minus the duration of half a period of the chrominance carrier wave.

A controller 22 accordingly controls the memory elements included in the delay circuit 2. According to that which has been stated above, this second delay circuit is to effect a delay of the picture signal applied thereto by half a period duration. With the selected sampling clock which is four times the chrominance carrier wave, this means that a delay of the picture signal for the duration of two sampling clock signals can be effected. Such a delay can be achieved with exactly three memory elements which are included in the delay circuit 2.

Based on the phase relationships explained above of the output signals of the delay circuit 1 as well as the delay circuit 2, the sample values of the picture signal read from the memory capacitors 13 of the two delay circuits are superimposed on the common readout line 15 in such a phase position that the waves of the chrominance carrier on which the color under signals are modulated are in quadrature phase. In consequence, the chrominance carriers and thus the color under signal is canceled. In the arrangement shown in FIG. 2 a separate adder is saved in that this phase relationship is selected; what is more, the readout line 15 nearly acts as an adder.

The readout line 15 is connected to a non-inverting input 31 of an operational amplifier 32. The operational amplifier 32 is connected, on the exterior, to a feedback network which compensates for the non-linear properties of the memory capacitors 13. The feedback network thereto includes two capacitors 33 which have each the same properties as a memory capacitor 13 of the memory circuits 1 and 2. In the feedback network it is necessary to have two capacitors 33 that have this property, because two memory capacitors 13 of the delay circuits 1 and 2 are to be connected simultaneously to the readout line 15. This feedback network is connected on the output side to the inverting input 34 of the operational amplifier 32.

Furthermore, a compensation line 41 is included to which compensating transistors 42 are connected. These compensating transistors 42 are of like number and have like properties to the transistors 14 of the delay circuits 1 and 2. The use of the compensation line 41 and of the compensating transistors 42 connected thereto is to compensate for the influences which the transistors 14 connected to the readout line 15 have on the signal read from this readout line. A signal read from a memory capacitor 13 of the delay circuit 1 or 2 is particularly influenced by the capacitive effects of these read transistors 14. This influencing of the signal is compensated for by the compensating transistors 42 and the compensation line 41 which are connected to the inverting input of the operational amplifier 32.

The output signal of the amplifier 32 in which the color under signal is suppressed on the basis of the phase relationship explained above, reaches a Sample and Hold stage 43 which is symbolically denoted in FIG. 2 by a transistor. The individual sample values read from the transistors 13 of the two delay circuits 1 and 2, which values then reach the Sample and Hold stage 43 via the transistor 32, are kept at a constant value here for a given period. After this, the filter 6 occurs which again smooths the step-shaped output signal of the Sample and Hold stage 43. The filter 6 produces on its output the output signal of the comb filter arrangement which is referenced BS' in FIG. 2.

Instead of an operational amplifier having a low-impedance output (voltage output), it is also possible to insert so-called OTA's (Operational Transconductance Amplifier) which have a high-impedance output (current output).

The arrangement shown in FIG. 2 operates without a smoothing circuit, is simply integrable and additionally has the advantage that it has a highly simple structure, because the comb filter function is possible here without a special adder or subtracter and the signal to be processed BS' is subjected to the least possible delay.

What is claimed is:
1. A comb filter arrangement comprising:
   at least one delay circuit; and
   adder means for adding signals of a twice supplied video signal modulated on a carrier, the supplied video signals being applied mutually shifted with time, at least one of the video signals applied to the adder being delayed by the delay circuits and wherein:
   the delay circuit includes means for providing a relative delay between the two video signals applied to the adder means, the delay being an integral multiple of the duration of one picture line of the video signal plus or minus an integral multiple of the period of the carrier, the carrier period multiple being less than the number of carrier periods in one picture line.
2. The comb filter arrangement as claimed in claim 1, wherein:
   the two video signals applied to the adder means are each delayed by a delay circuit; and the delay circuit includes means for providing a relative delay between the two signals applied to the adder means such that the output signals of the delay circuit are delayed relative to each other for an integral multiple of the duration of one picture line of the video signal plus or minus an integral multiple of period of the carrier.

3. The comb filter arrangement as claimed in claim 2, including means for filtering a video signal provided in accordance with the pal transmission standard and wherein the delay circuit includes means to delay the two video signals supplied to the adder means relative to each other, for the duration of two picture lines of the video signal plus or minus an integral multiple of the duration of one period of the carrier frequency.

4. The comb filter arrangement as claimed in claim 2, including means for filtering a video signal provided in accordance with the NTSC transmission standard and wherein the delay circuit includes means for delaying the two video signals supplied to the adder means relative to each other, for the duration of one picture line of the video signal plus or minus an integral multiple of the duration of one period of the carrier frequency.

5. The comb filter arrangement as claimed is claim 2, the two delay circuits have memory capacitors whose stored values can be read from a common readout line shared by the two delay circuits on which readout line the stored values are additively superimposed when read out, so that the readout line represents the adder means.

6. The comb filter arrangement as claimed in claim 1, wherein:
   the arrangement is adapted to filter a video signal in accordance with the PAL transmission standard; and
   the delay circuit includes means for providing the two video signals applied to the adder means delayed relative to each other for the duration of two picture lines of the video signal plus or minus an integral multiple of the period of the carrier.

7. The comb filter arrangement as claimed is claim 6, wherein two delay circuits have:
   a common readout line; and
   memory capacitors stored values for reading out onto the readout line shared by the two delay circuits on which readout line the stored values are additively superimposed when read out, so that the readout line represents the adder means.

8. The comb filter arrangement as claimed in claim 1, wherein:
   the delay circuit includes means for delaying a video signal which is in accordance with the NTSC transmission standard; and
   the delay circuit includes means for providing the two video signals applied to the adder means delayed relative to each other for the duration of one picture line of the video signal plus or minus an integral multiple of the period of the carrier frequency.

9. The comb filter arrangement as claimed in claim 8, wherein:
   there are two delay circuits each having memory capacitors with stored values and a common readout line; and
   each circuit includes means for reading the stored values out on the readout line and the stored values are additively superimposed when read out, so that the readout line represents the adder means.

10. The comb filter arrangement as claimed in claim 1, wherein the comb filter arrangement is adapted for filtering a color under signal modulated on a chrominance carrier filtered from a reading signal of a video recorder.

11. The comb filter arrangement as claimed in claim 10, further comprising means for sampling the color signal with a sampling clock before it is processed in the delay circuit which clock includes means to provide signals at an integral multiple of, but at least twice the double chrominance carrier frequency.

12. The comb filter arrangement as claimed in claim 11, wherein the sampling clock includes means to provide a signal at four times the chrominance carrier frequency.

13. The comb filter arrangement as claimed in claim 10, comprising:
   a first delay circuit including means for delaying the color signal for the duration of two picture lines minus the duration of half a period of the chrominance carrier; and
   a second delay circuit including means to delay the color signal for the duration of half a period of the chrominance carrier;
   and wherein
   the output signals of the two delay circuits are applied to the adder means.

14. The comb filter arrangement of claim 1 in which the delay circuit is arranged in a switched capacitor technique.

15. A comb filter arrangement comprising:
   at least one delay circuit; and
   adder means for adding signals of a twice supplied video signal modulated on a carrier, the supplied video signals being applied mutually shifted with time, at least one of the video signals applied to the adder being delayed by the delay circuit;
   and wherein the delay circuit includes:
      means for providing a relative delay between the two video signals applied to the adder means, the delay being an integral multiple of the duration of one picture line of the video signal plus or minus an integral multiple of the period of the carrier;
      for each memory capacitor, a respective read transistor is connected between the capacitor and read out line and controlled so that a charge stored in the memory capacitor is selectively read out on the readout line;
      a compensation line;
      compensating transistors, with line connection and structure electronically similar to that of the read transistors connected to the readout line, are connected to the compensation line; and
      an amplifier with a non-inverting input coupled to the readout line and a inverting input coupled the compensation line and an output providing a comb-filtered signal.

16. A video recorder comprising:
   adder means for adding signals of a twice supplied video signal modulated on a carrier, which video signals are supplied mutually shifted with time; and
   at least one delay circuit means for delaying at least one of the video signals supplied to the adder means and including means for providing a relative delay between the two video signals supplied to the adder means, which delay is a multiple of the duration of one picture line of the video signal plus or minus a multiple of the duration of one period of the carrier frequency, the carrier period multiple being less than the number of carrier periods in one picture line;
   and wherein the recorder is adapted for filtering out color under signals caused by crosstalk from adjacent tracks in a reading signal containing a color under signal.

17. The comb filter arrangement of claim 16 in which the delay circuit is arranged in a switched capacitor technique.

18. A television set comprising:
- adder means for adding signals of a twice supplied video signal modulated on a carrier, which video signals are supplied mutually shifted with time; and
- at least one delay circuit means for delaying at least one of the video signals supplied to the adder means and including means for providing a relative delay between the two video signals supplied to the adder means, which delay is an integral multiple of the duration of one picture line of the video signal plus or minus an integral multiple of the duration of one period of the carrier frequency, the carrier period multiple being less than the number of carrier periods in one picture line.

19. The comb filter arrangement of claim 18 in which the delay circuit is arranged in a switched capacitor technique.

20. A method of providing a component, comprising the steps of:
- providing an adder with a video signal output;
- connecting inputs of the adder to receive two or more copies of the same video signal with relative delays between the copies;
- connecting at least one delay circuit for delaying at least one of the copies of the video signal by an integral multiple of the duration of one picture line of the video signal plus or minus an integral multiple of the period of a carrier which modulates the video signal, the carrier period multiple being less than the number of carrier periods in one picture line.

* * * * *